United States Patent
Nagarajan et al.

(10) Patent No.: US 8,237,475 B1
(45) Date of Patent: Aug. 7, 2012

(54) TECHNIQUES FOR GENERATING PVT COMPENSATED PHASE OFFSET TO IMPROVE ACCURACY OF A LOCKED LOOP

(75) Inventors: Pradeep Nagarajan, Santa Clara, CA (US); Sean Shau-Tu Lu, San Jose, CA (US); Chiakang Sung, Milpitas, CA (US); Joseph Huang, Morgan Hill, CA (US); Yan Chong, San Jose, CA (US)

(73) Assignee: Altera Corporation, San Jose, CA (US)

( * ) Notice: Subject to any disclaimer, the term of this patent is extended or adjusted under 35 U.S.C. 154(b) by 220 days.

(21) Appl. No.: 12/248,031

(22) Filed: Oct. 8, 2008

(51) Int. Cl.
  *H03L 7/06* (2006.01)
(52) U.S. Cl. ......... 327/158; 327/149; 327/141; 327/155
(58) Field of Classification Search .................. 327/141, 327/144–163; 331/15–17; 375/373–376
  See application file for complete search history.

(56) References Cited

U.S. PATENT DOCUMENTS

| | | | |
|---|---|---|---|
| 6,225,843 B1 * | 5/2001 | Taniguchi et al. | 327/158 |
| 6,570,944 B2 * | 5/2003 | Best et al. | 375/355 |
| 6,741,107 B2 * | 5/2004 | Borkar et al. | 327/153 |
| 6,940,768 B2 * | 9/2005 | Dahlberg et al. | 365/201 |
| 7,091,760 B1 * | 8/2006 | Chang et al. | 327/158 |
| 7,109,767 B1 * | 9/2006 | Amick et al. | 327/158 |
| 7,205,802 B1 * | 4/2007 | Wang et al. | 327/149 |
| 7,212,054 B1 | 5/2007 | Chang et al. | |
| 7,227,395 B1 * | 6/2007 | Huang et al. | 327/161 |
| 2005/0052208 A1 * | 3/2005 | Starr | 327/156 |
| 2006/0158262 A1 * | 7/2006 | Robinson et al. | 331/16 |
| 2006/0164141 A1 * | 7/2006 | Self | 327/158 |

* cited by examiner

*Primary Examiner* — Lincoln Donovan
*Assistant Examiner* — Brandon S Cole
(74) *Attorney, Agent, or Firm* — Steven J. Cahill

(57) ABSTRACT

A circuit includes a locked loop and a phase offset circuit. The locked loop generates first control signals for controlling a first delay in the locked loop. The phase offset circuit delays an input signal by a second delay that is controlled by second control signals to generate a delayed signal. The phase offset circuit generates the second control signals by adjusting the first control signals to increase the accuracy of the delayed signal with respect to a target phase. The second control signals compensate for at least a portion of a change in the second delay that is caused by a variation in at least one of a process, a supply voltage, and a temperature of the circuit.

25 Claims, 7 Drawing Sheets

US 8,237,475 B1

TECHNIQUES FOR GENERATING PVT COMPENSATED PHASE OFFSET TO IMPROVE ACCURACY OF A LOCKED LOOP

BACKGROUND OF THE INVENTION

The present invention relates to electronic circuits, and more particularly, to techniques for generating a phase offset that is compensated for process, supply voltage, and temperature (PVT) variations to improve the accuracy of a locked loop.

Locked loop circuits such as delay-locked loop circuits typically adjust a phase of a feedback signal in response to a periodic input signal.

BRIEF SUMMARY OF THE INVENTION

According to some embodiments of the present invention, a circuit includes a locked loop and a phase offset circuit. The locked loop generates first control signals for controlling a first delay in the locked loop. The phase offset circuit delays an input signal by a second delay that is controlled by second control signals to generate a delayed signal. The phase offset circuit generates the second control signals by adjusting the first control signals to increase the accuracy of the delayed signal with respect to a target phase. The second control signals compensate for at least a portion of a change in the second delay that is caused by a variation in at least one of a process, a supply voltage, and a temperature of the circuit. The present invention includes methods, circuits, and systems for performing the embodiments described herein.

Various objects, features, and advantages of the present invention will become apparent upon consideration of the following detailed description and the accompanying drawings.

DETAILED DESCRIPTION OF THE INVENTION

In Double-Data Rate (DDR) memory circuits, data bits are transferred on every rising edge and every falling edge of a read strobe signal, as opposed to only once per cycle. Because data is transmitted or captured on both rising and falling edges of the read strobe signal, two bits of data are sent or received in every cycle of the read strobe signal (i.e., a double-data rate). Data is accessed in multi-bit bursts of 2, 4, 8, 16, etc. bits.

Figure 1:
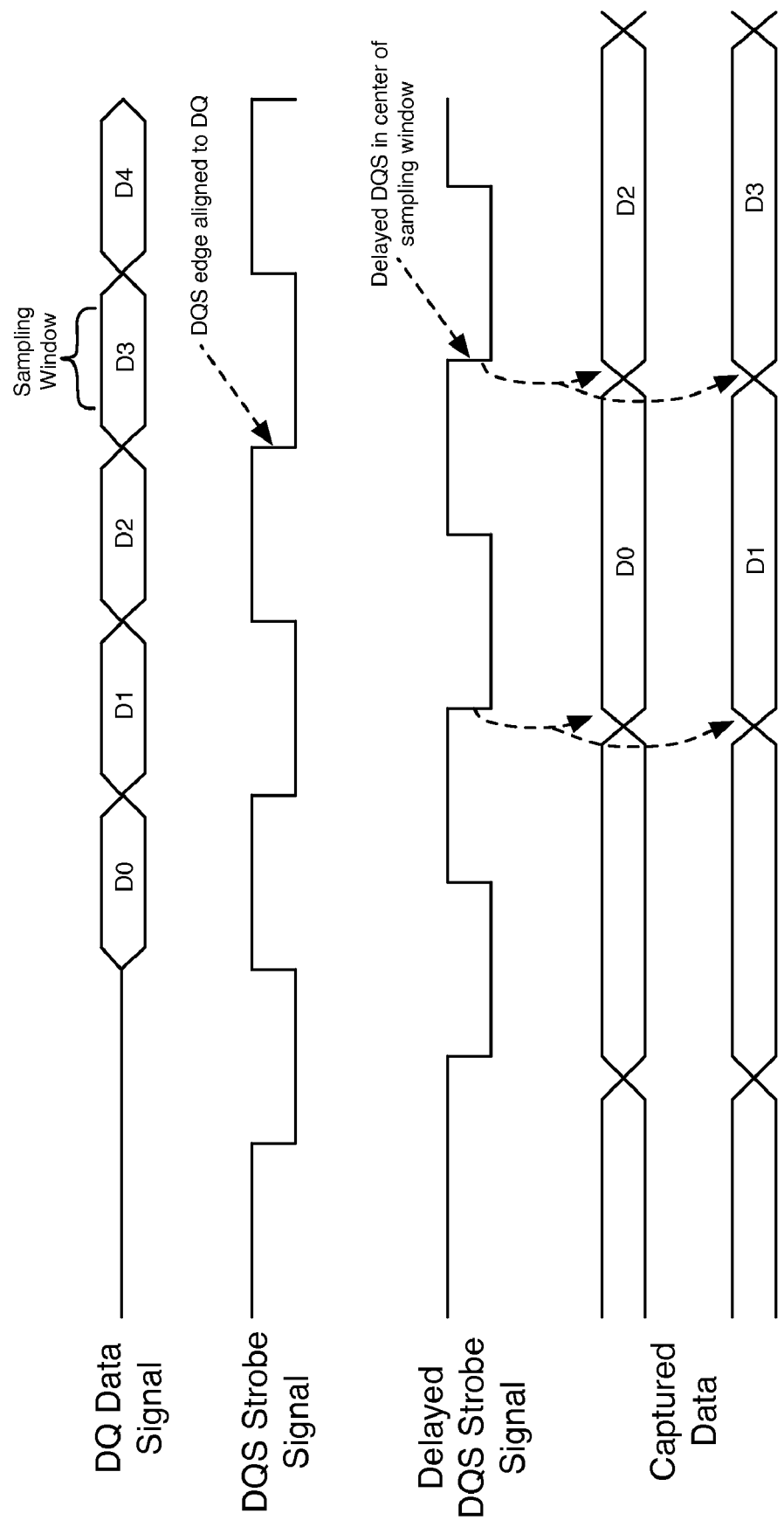
FIG. 1 illustrates example waveforms of signals that can be used in conjunction with a double data rate memory circuit.

FIG. 1 illustrates example waveforms of signals that can be used in conjunction with a double data rate memory circuit. FIG. 1 illustrates examples of waveforms for a data signal (also referred to as the DQ data signal), a read strobe signal (also referred to as the DQS strobe signal), a delayed DQS strobe signal, and captured data signals. The DQS strobe signal is transmitted from the memory circuit to a receiving device aligned to the edge of the data signal. In order to ensure that valid data is captured by the DQS strobe signal, the DQS strobe signal is delayed to generate a delayed DQS strobe signal. The edges of the delayed DQS strobe signal are in the centers of the data sampling windows. Dedicated phase shift circuitry is used to produce the delayed DQS strobe signal, as described below with respect to FIG. 2. An example of a data sampling window is shown in FIG. 1 for data bit D3, although each data bit can be sampled during a valid data sampling window for that data bit.

A locked loop circuit can be used to achieve a (360/N)×M degree phase shift on the DQS strobe signal by placing an M number of delay circuit elements in the path of the DQS strobe signal. N is the number of delay circuit elements in the delay chain of the locked loop. M/N corresponds to the desired phase shift in the delayed DQS strobe signal. If, for example, N equals 8, M can be selected to be a number from 1 through 8 to achieve a phase shift of 45°, 90°, 135°, 180°, 225°, 270°, 315°, or 360°. The phase shift circuitry can delay the DQS strobe signal using control signals from the locked loop in order to cause the delayed DQS strobe signal to have a desired phase with respect to the data sampling window.

However, a locked loop can only provide a minimum accuracy of (360/N)×M. The accuracy of the locked loop can be improved by increasing the number N of delay circuit elements in the delay chain. However, adding more delay circuit elements to the delay chain in a locked loop has many practical drawbacks.

For example, there is a limitation on the number of N delay circuit elements that can be added to a delay chain of a locked loop (e.g., a delay-locked loop). A larger number of N delay circuit elements corresponds to a larger intrinsic delay in the delay chain that prevents the locked loop from being able to lock on to input clock signals having periods that are shorter than the intrinsic delay. Thus, increasing the number N of delay circuit elements in order to increase the accuracy prevents a locked loop from functioning in response to input clock signals having larger frequencies. This limitation can be a problem in locked loops that are designed to be used with input clock signals having a wide range of frequencies.

According to some embodiments of the present invention, circuits are provided that can improve the minimum accuracy of a delayed signal beyond (360/N)×M. More accuracy is needed, because the optimum point for rising and falling edges of the DQS strobe signal within the data sampling window depends on a number of factors such as DQ-DQ skew, DQ-DQS skew, and leveling delay for different DQ groups. Also, process, supply voltage, and temperature variations of the circuit can cause the rising and falling edges of the DQS strobe signal to shift away from the centers of the data sampling windows.

For example, it may be necessary to delay the DQS strobe signal by 100° for the rising and falling edges of the delayed DQS strobe signal to occur at the centers of the data sampling windows. A locked loop with 8 delay circuit elements in the delay chain can be used to delay an input clock signal that has a frequency, e.g., of 533 MHz. This locked loop has a minimum accuracy of 45°, and therefore it cannot be used to delay the DQS strobe signal by 100°. The closest delay that this locked loop can generate to 100° is 90°, which corresponds to a phase error margin of 10°.

At higher frequencies of the input clock signal (e.g., 667 MHz) a locked loop having 6 delay circuit elements in the delay chain can be used to generate a minimum accuracy of 60° (360°/6). This locked loop can be used to generate up to 20° of phase error margin for a 100° target phase offset ((60°×2)−100). A phase error margin of 20° may cause the system to fail at a high input clock signal frequency (e.g., 667 MHz). Therefore, there is a need for systems that increase the accuracy of the phase of the DQS strobe signal relative to a target phase (e.g., the center of the data sampling window) and that can compensate for changes in the delayed DQS strobe signal that are caused by variations in the process, supply voltage, and temperature of the circuit.

Figure 2:
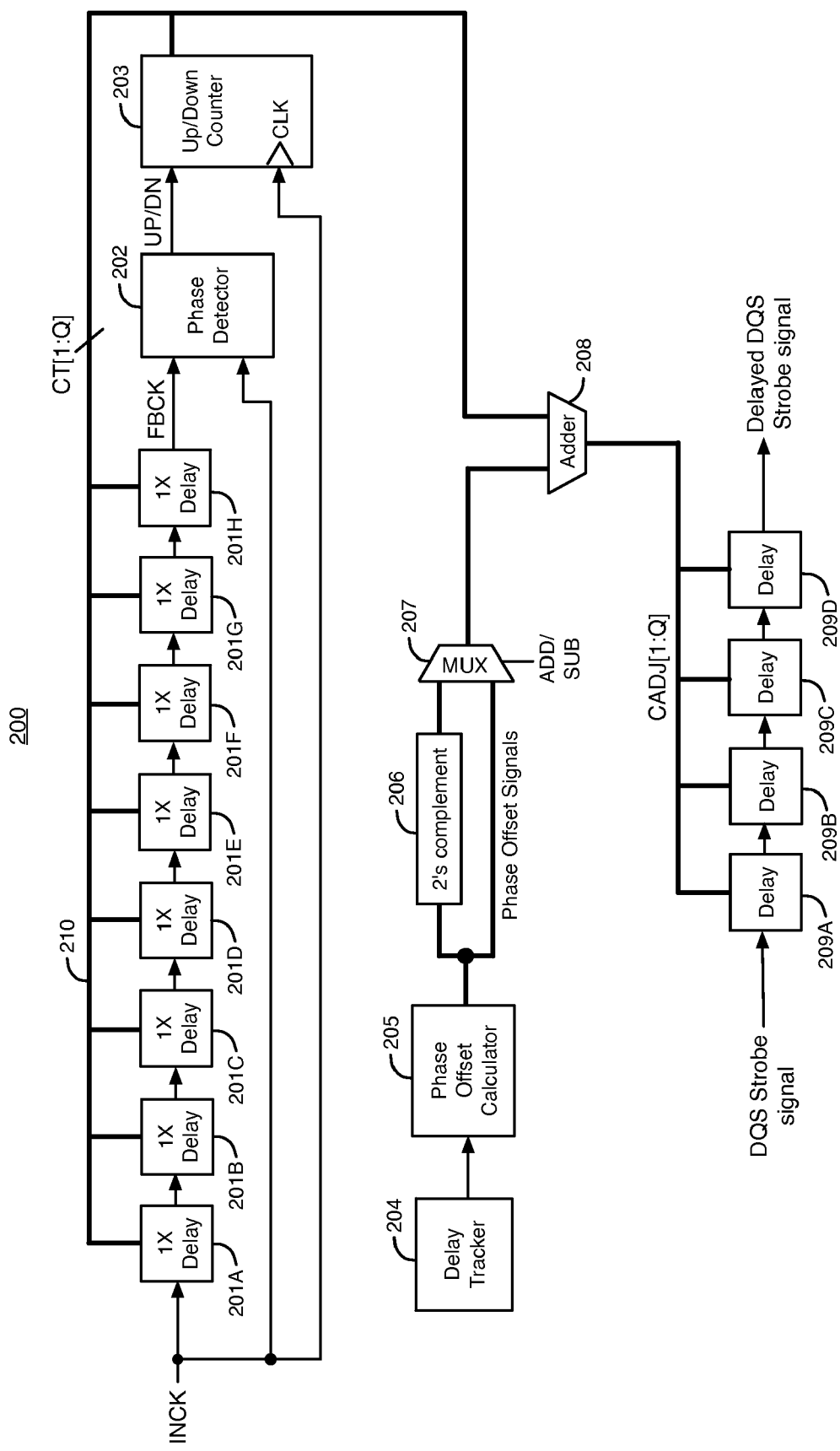
FIG. 2 illustrates examples of a digitally controlled delay-locked loop circuit and phase offset circuitry, according to an embodiment of the present invention.

FIG. 2 illustrates examples of a digitally controlled delay-locked loop (DLL) circuit and phase offset circuitry, according to an embodiment of the present invention. Circuit 200 shown in FIG. 2 includes 8 delay circuit elements 201A-201H, phase detector 202, up/down counter 203, delay tracker 204, phase offset calculator 205, 2's complement circuit 206, multiplexer (MUX) 207, adder circuit 208, 4 delay circuit elements 209A-209D, and bus 210.

Delay circuit elements 201A-201H, phase detector 202, up/down counter 203, and bus 210 form a digitally controlled delay-locked loop (DLL) circuit. This DLL can have any suitable number of delay circuit elements 201. Eight delay circuit elements 201 are shown in FIG. 2 merely as an example.

Circuit 200 is typically fabricated on an integrated circuit. Circuits of the present invention can, for example, be fabricated on an application specific integrated circuit (ASIC) or a programmable logic integrated circuit, such as a field programmable gate array (FPGA).

Delay circuit elements 201A-201H are coupled together in series in the delay path of a periodic input clock signal INCK to form a delay chain. Delay circuit elements 201A-201H delay input clock signal INCK to generate a periodic feedback clock signal FBCK. The 8 delay circuit elements 201A-201H generate a delay in FBCK that varies in response to the binary value of a set of count signals CT[1:Q].

Each of the delay circuit elements 201A-201H in the delay chain has the same delay at any given time. The delay of delay circuit elements 201A-201H is referred to as 1X. Each of the delay circuit elements 201A-201H adds an additional delay of 1X to feedback clock signal FBCK relative to input clock signal INCK. As a result, the feedback clock signal FBCK is delayed by 8X relative to the input clock signal INCK. In one embodiment, each of the delay circuit elements 201A-201H and 209A-209D has the same delay circuit architecture and the same size transistors as each of the other delay circuit elements 201A-201H and 209A-209D.

The input clock signal INCK is routed to an input terminal of delay circuit element 201A, to a first input terminal of phase detector 202, and to a clock CLK input terminal of up/down counter 203. The feedback clock signal FBCK is generated at an output terminal of delay circuit element 201H and is routed to a second input terminal of phase detector 202. Phase detector 202 compares the phase of the feedback clock signal FBCK to the phase of the input clock signal INCK to generate a digital UP/DN signal.

Up/down counter 203 generates a Q number of digital count signals CT[1:Q] in response to the input clock signal INCK and the UP/DN signal. Up/down counter 203 can, for example, generate 5 digital count signals (Q=5). The digital count signals are referred to as count signals CT[1:Q]. The count signals CT[1:Q] are transmitted in parallel through a bus 210 to input terminals of each of the delay circuit elements 201A-201H. The binary value of the count signals CT[1:Q] determines the delay of each of the delay circuit elements 201A-201H.

The function of the delay-locked loop (DLL) in circuit 200 is to generate a combined delay through delay circuit elements 201A-201H that causes the phase of FBCK to be 360 degrees ahead of the phase of INCK. The DLL adjusts the variable delay of delay circuit elements 201A-201H by varying the binary value of count signals CT[1:Q], which control the variable delay of delay circuit elements 201A-201H.

When the phase of the feedback clock signal FBCK is less than 360° ahead of the phase of the input clock signal INCK, phase detector 202 generates a logic high state in the UP/DN signal. When the UP/DN signal is in a logic high state, up/down counter 203 increases the binary value of the count signals CT[1:Q], causing the delay of each of the delay circuit elements 201A-201H to increase.

When the phase of the feedback clock signal FBCK is more than 360° ahead of the phase of the input clock signal INCK, phase detector 202 generates a logic low state in the UP/DN signal. When the UP/DN signal is in a logic low state, up/down counter 203 decreases the binary value of the count signals CT[1:Q], causing the delay of each of the delay circuit elements 201A-201H to decrease.

The change in the delay of each of the delay circuit elements 201A-201H that occurs when the binary value of the count signals CT[1:Q] increases by 1 or decreases by 1 is referred to as the step delay $D_{STEP}$. When the binary value of the count signals CT[1:Q] increases by 1, the total delay of the delay chain formed by delay circuit elements 201A-201H increases by $N \times D_{STEP}$. When the binary value of the count signals CT[1:Q] decreases by 1, the total delay of the delay chain formed by delay circuit elements 201A-201H decreases by $N \times D_{STEP}$.

When the combined delay of delay circuit elements 201A-201H causes the phase of the FBCK signal to be 360 degrees ahead of the phase of the input clock signal INCK, the DLL in circuit 200 is in lock mode. The binary value of the count signals in lock mode is referred to as $CT[1:Q]_{LOCK}$.

In the lock mode of the DLL, counter 203 maintains the binary value of the count signals CT[1:Q] constant. Phase detector 202 monitors when the DLL formed by circuits 201-203 is in lock mode. When phase detector 202 detects that the DLL is not in lock mode, an enable signal (not shown) that is transmitted from phase detector 202 to counter 203 causes counter 203 to adjust the count signals CT[1:Q] in response to the UP/DN signal. When phase detector 202 detects that the DLL is in lock mode, phase detector 202 causes the enable signal to transition to a state that causes counter 203 to maintain the count signals CT[1:Q] in constant logic states. When the DLL goes out of lock mode, phase detector 202 causes the enable signal to allow counter 203 to adjust the count signals again.

The minimum delay ($D_{MIN}$) of each of the delay circuit elements 201A-201H is the delay that each delay circuit element 201A-201H generates when the binary value of the count signals CT[1:Q] equals zero. The minimum delay of each of the delay circuit elements 209A-209D equals the minimum delay of each delay circuit element 201A-201H. The minimum delay of each delay circuit element 201A-201H and 209A-209D does not vary in response to changes in the binary value of the count signals CT[1:Q]. However, the minimum delay of each delay circuit element 201A-201H and 209A-209D may change in response to variations in the process, supply voltage, or temperature of circuit 200.

The step delay $D_{STEP}$ and the minimum delay $D_{MIN}$ of the delay circuit elements 201A-201H are affected by variations in the process, supply voltage, and temperature of circuit 200. When the step delay and the minimum delay of delay circuit elements 201A-201H change in response to a change in the process, the temperature, or the supply voltage of circuit 200 when the DLL is in lock mode, counter 203 adjusts the binary value of the count signals CT[1:Q] in order to maintain the delay of each delay circuit element 201A-201H at 45 degrees of INCK so that the phase of FBCK remains at 360 degrees ahead of the phase of INCK at phase detector 202.

When the phase of the feedback clock signal FBCK is 360 degrees ahead of the phase of the input clock signal INCK, the DLL formed by circuits 201-203 is in lock mode. When the DLL is in lock mode, the delay of delay circuit elements 201A-201H can be expressed as shown below in equation (1). In equation (1), $D_{MIN}$ is the minimum delay of each delay circuit element 201A-201H, $D_{VARIABLE}$ is the variable delay of each delay circuit element 201A-201H, and N is the number of delay circuit elements 201 in the delay chain of the DLL. The variable delay $D_{VARIABLE}$ of each delay circuit element 201A-201H is the delay of the delay circuit element at a particular binary value of the count signals CT[1:Q] minus the minimum delay $D_{MIN}$. The variable delay $D_{VARIABLE}$ of each delay circuit element 201A-201H changes in response to changes in the binary value of count signals CT[1:Q].

$$D_{MIN} + D_{VARIABLE} \equiv \frac{360°}{N} \quad (1)$$

Circuit 200 uses an N number of delay circuit elements 201 to lock FBCK on to the phase of the input clock signal INCK. The period of INCK corresponds to 360 degrees. Equation (2) below is an equation for the variable delay $D_{VARIABLE}$ of each of the delay circuit elements 201A-201H. In equation (2), $CT[1:Q]_{LOCK}$ is the binary value of the count signals CT[1:Q] when the DLL is in lock mode, and $D_{STEP}$ is the step delay. As mentioned above, the change in the delay of each of the delay circuit elements 201A-201H when the binary value of the count signals CT[1:Q] increases by 1 or decreases by 1 is referred to as the step delay, $D_{STEP}$.

$$D_{VARIABLE} = CT[1:Q]_{LOCK} \times D_{STEP} \quad (2)$$

Substituting equation (2) into equation (1) yields equation (3) below.

$$D_{MIN} + (CT[1:Q_{LOCK}] \times D_{STEP}) \equiv \frac{360°}{N} \quad (3)$$

The minimum delay $D_{MIN}$ can be divided by the step delay $D_{STEP}$ to generate a value $C_{MIN}$, such that $C_{MIN} = D_{MIN}/D_{STEP}$. $C_{MIN}$ represents the number of times that the minimum delay $D_{MIN}$ of each delay circuit element 201A-201H can be divided by the step delay $D_{STEP}$ of each delay circuit element 201A-201H. Equation (3) can be rewritten using $C_{MIN}$, as shown below in equation (4).

$$(D_{STEP} \times D_{MIN}) + (D_{STEP} \times CT[1:Q]_{LOCK}) \equiv \frac{360°}{N} \quad (4)$$

The left side of equation (4) is in the time domain, and the right side of equation (4) is in degrees. When the step delay $D_{STEP}$ is uniform, equation (4) can be rewritten as shown below in equation (5).

$$C_{MIN} + CT[1:Q]_{LOCK} \equiv \frac{360°}{N} \quad (5)$$

Thus, 1 degree=$((C_{MIN}+CT[1:Q]_{LOCK})\div(360/N))$. Any required offset in phase of X degrees can be achieved by modifying the binary value of the count signals CT[1:Q] generated by counter 203, as shown below in equation (6). In equation (6), the Phase Offset value on the left side refers to the binary value of the count signals CT[1:Q] that generates a phase offset of X degrees in each of the delay circuit elements 201A-201H and 209A-209D. Phase offset X is an input value that is transmitted to phase offset calculator 205 from outside circuit 200.

$$\text{Phase Offset} = X \times \left((C_{MIN} + CT[1:Q]_{LOCKED}) \div \left(\frac{360°}{N}\right)\right) \quad (6)$$

Examples values for the variables in equations (4) and (5) are now provided. These example values are provided for the purpose of illustration and are not intended to limit the scope of the present invention to these particular values. If delay circuit elements 201A-201H have, for example, a step delay $D_{STEP}$ of 12 picoseconds (ps), the input clock signal INCK has a frequency of 533 MHz (and a period of 1876 ps), then the delay of each delay circuit element 201A-201H in lock mode is 1876/8=234.5 ps. The delay of each delay circuit element 201A-201H in lock mode equals the minimum delay plus the variable delay, as shown in equation (1). If the value of $C_{MIN}$ is determined to be equal to 16, then the minimum delay $D_{MIN}$=16×12=192 ps, and circuit 200 generates a binary value in the count signals $CT[1:Q]_{LOCK}$ that equals 4 when in lock mode. Using these example values in equations (4) and (5) yields the following results.

(12 ps×16)+(12 ps×4)=240 ps≈(1876 ps)/8 count signal value of (16+4)≡360°/8 count signal value of 1≡2.25°

Using these example values, each increase of 1 or decrease of 1 in the binary value of the count signals CT[1:Q] causes delay circuit element 209A (and each of the other delay circuit elements 209B-209D) to add a phase shift of 2.25 degrees to the phase of the delayed DQS strobe signal. This information can be used to adjust the phase offset in the delayed DQS strobe signal by changing the binary value of the count signals CT[1:Q]. Circuit 200 can compensate for at least a portion of the process/voltage/temperature induced variations in the delay of delay circuit elements 209A-209D by adjusting the binary value of $CT[1:Q]_{LOCK}$.

Circuit 200 has a phase offset circuit that includes delay tracker 204, phase offset calculator 205, 2' complement circuit 206, multiplexer 207, adder 208, and delay circuit elements 209A-209D. The delay circuit elements 209A-209D delay the DQS strobe signal to generate the delayed DQS strobe signal. The delayed DQS strobe signal has a phase offset relative to the DQS strobe signal. The phase offset circuit generates the delay provided to the delayed DQS strobe signal based on the CT[1:Q] count signals.

According to some embodiments, delay tracker 204 determines the value $C_{MIN}$ used in equations (4)-(6). Delay tracker 204 adjusts the value of $C_{MIN}$ in response to changes in the minimum delay $D_{MIN}$ and the step delay of the delay circuit elements that are caused, for example, by process, supply voltage, and temperature variations in circuit 200.

Phase offset calculator 205 receives the value $C_{MIN}$ from delay tracker 204. Phase offset calculator 205 calculates the Phase Offset value shown in equation (6) using equation (6) and $C_{MIN}$. Phase offset calculator 205 generates a set of Phase Offset signals. Phase offset calculator 205 causes the binary value of the Phase Offset signals to equal the Phase Offset value calculated using equation (6). The Phase Offset signals are transmitted in parallel to input terminals of 2's complement circuit 206 and multiplexer 207. 2's complement circuit 206 inverts the arithmetic sign of the Phase Offset value to generate a negative Phase Offset value. 2's complement circuit 206 generates negative Phase Offset signals that have a binary value equal to the negative Phase Offset value. The negative Phase Offset signals are transmitted to multiplexer 207.

Multiplexer 207 transmits either the Phase Offset signals or the negative Phase Offset signals to adder 208 in response to the logic state of an ADD/SUB select signal. If multiplexer 207 selects the Phase Offset signals, adder 208 adds the Phase Offset value to the binary value of the count signals CT[1:Q] to generate a Q number of adjusted count signals CADJ[1:Q]. If multiplexer 207 selects the negative Phase Offset signals, adder 208 adds the negative Phase Offset value to the binary value of the count signals CT[1:Q] to generate the adjusted count signals CADJ[1:Q]. The adjusted count signals CADJ[1:Q] are transmitted to delay circuit elements 209A-209D. The adjusted count signals CADJ[1:Q] control the delay of delay circuit elements 209A-209D. Delay circuit elements 209A-209D are coupled together in series in the delay path of the DQS strobe signal.

Delay circuit elements 209A-209D delay the DQS strobe signal to generate the delayed DQS strobe signal at the output terminal of delay circuit element 209D. The CADJ[1:Q] signals may control all of the delay circuit elements 209A-209D or less than all of the delay circuit elements 209A-209D. In some embodiments, phase offset calculator 205 and adder 208 may transmit different values of the CADJ[1:Q] signals to each of the delay circuit elements 209A-209D, which allows the generation of a number of different phase offsets that can be added to the DQS strobe signal. In general, the number of delay circuit elements 209 is selected to cause each edge of the delayed DQS strobe signal to occur in the center of the data sampling window to ensure that the incoming data is accurately sampled.

Circuit 200 adjusts the binary value of the count signals CT[1:Q]$_{LOCK}$ by the Phase Offset value (or the negative Phase Offset value) to reduce the offset in the phase of the delayed DQS strobe signal relative to a target phase. The offset in the phase of the delayed DQS strobe signal is caused by changes in the delays of delay circuit elements 209A-209D that may be caused by variations in the process, supply voltage, or temperature (PVT) of circuit 200. The Phase Offset signals vary to compensate for PVT induced changes in the delays of delay circuit elements 209A-209D, because $C_{MIN}$ varies to compensate for PVT variations in $D_{MIN}$ and in $D_{STEP}$. The phase offset circuit of FIG. 2 compensates for at least a portion of the variations in the delays of delay circuit elements 209A-209D that are caused by process, supply voltage, and temperature variations in circuit 200, as described in further detail below. The phase offset circuit of FIG. 2 changes the delay of delay circuit elements 209A-209D to increase the accuracy of the phase of the delayed DQS strobe signal relative to a target phase (e.g., the center of the data sampling window).

The phase offset circuit in FIG. 2 is configured to delay the DQS strobe signal having any phase by a delay that is controlled by the CADJ[1:Q] signals to generate a delayed DQS strobe signal such that a maximum phase shift error between a phase of the delayed DQS strobe signal and a target phase (e.g., the center of the data sampling window) is less than T/2N. T is the period of the input clock signal INCK, and N is the total number of delay circuits 201 in the delay chain of the DLL.

Figure 3:
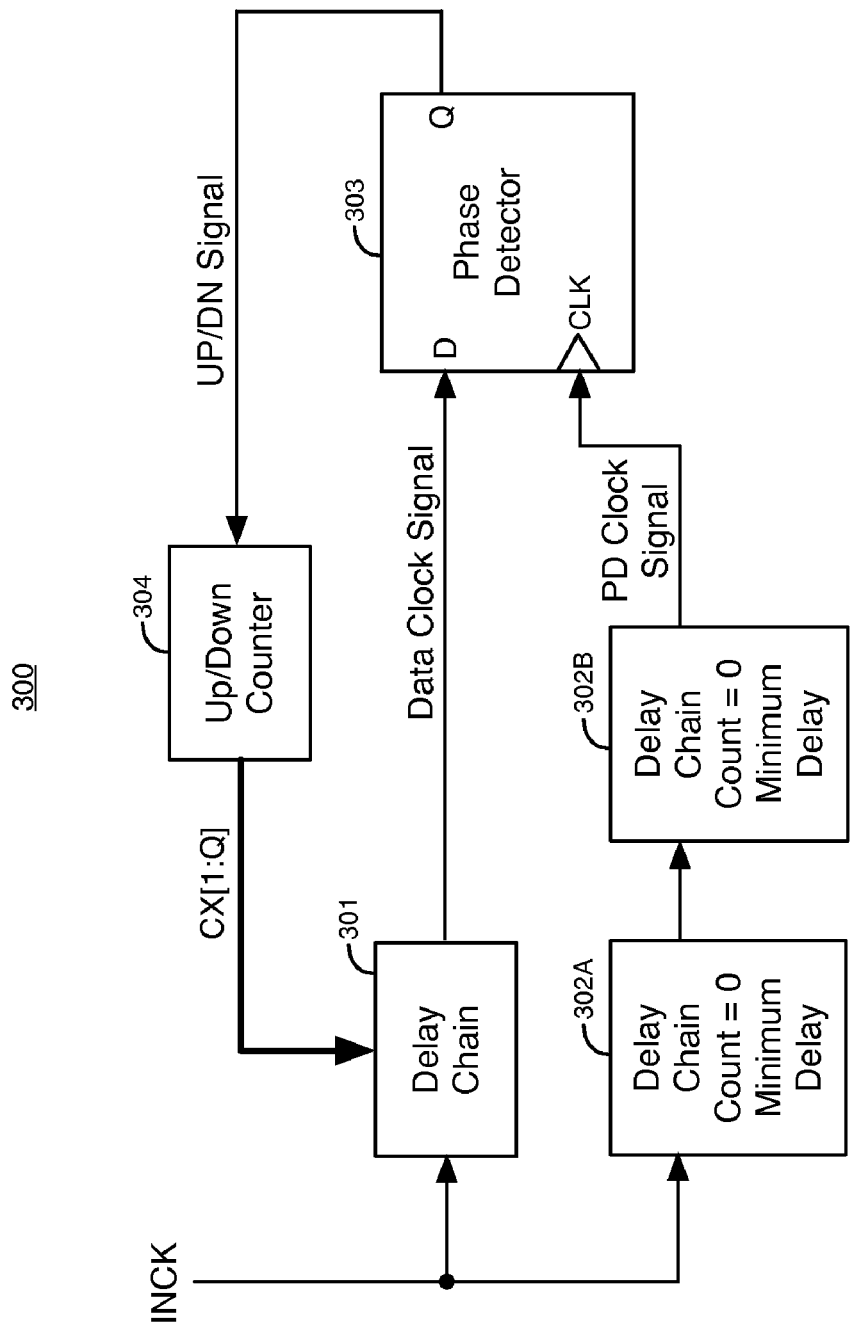
FIG. 3 illustrates an example of a delay tracker circuit, according to an embodiment of the present invention.

FIG. 3 illustrates an example of a delay tracker circuit, according to an embodiment of the present invention. Delay tracker circuit 300 shown in FIG. 3 is a hardware embodiment of delay tracker 204, which is shown in FIG. 2. Delay tracker circuit 300 includes delay chain 301, delay chain 302A, delay chain 302B, phase detector 303, and up/down counter circuit 304.

Delay chain 301 has only one delay circuit element. Delay chain 302A has only one delay circuit element. Delay chain 302B has only one delay circuit element. The delay circuit element in each of the delay chains 301, 302A, and 302B has the same circuit architecture and size as each of the 8 delay circuit elements 201A-201H. For example, the delay circuit element in delay chain 301 has the same circuit structure as delay circuit element 201A.

The input clock signal INCK is transmitted to input terminals of delay chains 301 and 302A. The output terminal of delay chain 302A is coupled to the input terminal of delay chain 302B. Each of the delay chains 301, 302A, and 302B adds a delay to the input clock signal INCK. Delay chain 301 delays INCK to generate the data clock signal shown in FIG. 3 at the D input terminal of phase detector 303. Delay chains 302A-302B delay INCK to generate the phase detector (PD) clock signal shown in FIG. 3 at the CLK input terminal of phase detector 303.

Counter circuit 304 generates a Q number of digital count signals CX[1:Q]. The delay of the delay circuit element in delay chain 301 is controlled by the count signals CX[1:Q] generated by counter circuit 304. The delay of the delay circuit element in delay chain 301 changes in response to each change in the binary value of count signals CX[1:Q].

Each of the delay chains 302A-302B delays the input clock signal INCK by the same amount of delay. The delays of delay chains 302A-302B are not controlled by the count signals CX[1:Q] generated by counter circuit 304. The delays of delay chains 302A and 302B do not change in response to changes in the binary value of count signals CX[1:Q]. Instead, the delay of delay chain 302A is set to the minimum delay that delay chain 302A can generate, and the delay of delay chain 302B is set to the minimum delay that delay chain 302B can generate. The delay of each delay chain 302A-302B equals the minimum delay of delay chain 301 when count signals CX[1:Q] have a binary value of 0. The delays of delay chains 302A-302B are fixed at the minimum delays. However, the delays of delay chains 302A-302B may change in response to variations in the process, supply voltage, and temperature of circuit 300.

Delay chain 301, phase detector 303, and counter 304 function as a digitally controlled delay-locked loop (DLL). Phase detector 303 compares the phase of the data clock signal to the phase of the PD clock signal. When the phase of the data clock signal is behind of the phase of the PD clock signal, phase detector 303 generates a logic high state in an UP/DN output signal. The UP/DN signal generated by phase detector 303 is transmitted to up/down counter 304. When the UP/DN signal is in a logic high state, counter 304 increases the binary value of the count signals CX[1:Q], causing the delay of delay chain 301 to increase. When the phase of the data clock signal is ahead of the phase of the PD clock signal, phase detector 303 generates a logic low state in the UP/DN signal. When the UP/DN signal is in a logic low state, counter 304 decreases the binary value of the count signals CX[1:Q], causing the delay of delay chain 301 to decrease.

When phase detector 303 detects that the phases of the data clock signal and the PD clock signal are aligned (or nearly aligned), counter 304 holds the binary value of the count signals CX[1:Q] constant in response to an enable signal (not shown) from phase detector 303, and the DLL formed by circuits 301 and 303-304 is in lock mode. When the DLL formed by circuits 301 and 303-304 is in lock mode, the binary value of the count signals CX[1:Q]$_{LOCK}$ equals C$_{MIN}$.

The delay D$_{DATA}$ of the data clock signal generated by delay chain 301 in the lock mode of the DLL relative to input clock signal INCK is shown below in equation (7), where D$_{MIN}$ is the minimum delay of delay chain 301, and D$_{STEP}$ is the step delay of delay chain 301.

$$D_{DATA}=D_{MIN}+(C_{MIN} \times D_{STEP}) \quad (7)$$

The minimum delay D$_{MIN}$ of delay chain 301 equals the delay D$_{MIN}$ of delay chain 302A, the delay D$_{MIN}$ of delay chain 302B, and the minimum delay D$_{MIN}$ of each of the delay circuit elements 201A-201H and 209A-209D. The step delay D$_{STEP}$ of delay chain 301 equals the step delay D$_{STEP}$ of each of the delay circuit elements 201A-201H and 209A-209D.

The delay D$_{PDCK}$ of the PD clock signal generated by delay chains 302A-302B in the lock mode of the DLL in circuit 300 relative to the input clock signal INCK is shown below in equation (8), where D$_{MIN}$ equals the delay of delay chain 302A and the delay of delay chain 302B.

$$D_{PDCK}=D_{MIN}+D_{MIN} \quad (8)$$

When the DLL formed by circuits 301, 303, and 304 is in lock mode, the delay of the data clock signal D$_{DATA}$ equals (or approximately equals) the delay D$_{PDCK}$ of the PD clock signal. As a result, equation (7) equals equation (8), as shown below in equation (9). Equation (9) can be solved for D$_{MIN}$, as shown below in equation (10).

$$D_{MIN}+(C_{MIN} \times D_{STEP})=2 \times D_{MIN} \quad (9)$$

$$D_{MIN}=C_{MIN} \times D_{STEP} \quad (10)$$

When the DLL formed by circuits 301 and 303-304 is in lock mode, delay chain 301 delays INCK by twice the delay provided to INCK by each of the delay chains 302A and 302B. Because the minimum delay of delay chain 301 equals the delay of delay chain 302A and the delay of delay chain 302B, the variable delay of delay chain 301 in lock mode equals the delay of delay chain 302A, the delay of delay chain 302B, and the minimum delay of delay chain 301 (i.e., D$_{VARIABLE}$=D$_{MIN}$). The binary value of the count signals CX[1:Q]$_{LOCK}$ in lock mode equals C$_{MIN}$. The binary value of the count signals CX[1:Q]$_{LOCK}$ in lock mode equals D$_{VARIABLE}$/D$_{STEP}$=C$_{MIN}$.

Phase offset calculator 205 uses C$_{MIN}$ and an input phase adjustment value of X degrees in equation (6) to calculate the Phase Offset value for adjusting count signals CT[1:Q]$_{LOCK}$ to generate signals CADJ[1:Q].

When variations in the process, the supply voltage, and/or the temperature of circuit 200 cause the delays of delay chains 301, 302A, and 302B to change, circuits 301, 303, and 304 automatically adjust the binary value of count signals CX[1:Q]$_{LOCK}$ in lock mode to cause the delay of delay chain 301 to equal the delay of delay chain 302A plus the delay of delay chain 302B. Delay tracker circuit 300 automatically adjusts the value of CX[1:Q]$_{LOCK}$, and thus the value of C$_{MIN}$, in response to variations in the process, the supply voltage, and/or the temperature (PVT) of circuit 200 that affect the delay of delay chain 301 to compensate for the effect that these PVT variations have on the D$_{MIN}$ and the D$_{STEP}$ of delay circuit elements 209A-209D. In response to any variations in the process, supply voltage, and temperature of circuit 200 that change CX[1:Q]$_{LOCK}$ and C$_{MIN}$, phase offset calculator 205 adjusts the Phase Offset signals. Adder 208 adjusts the binary value of CT[1:Q]$_{LOCK}$ using the Phase Offset signals so that the adjusted count signals CADJ[1:Q] at least partially compensate for PVT induced variations in the delays of delay circuit elements 209A-209D to increase the accuracy of the phase of the delayed DQS strobe signal relative to a target phase (e.g., the center of each data sampling window).

Figure 4:
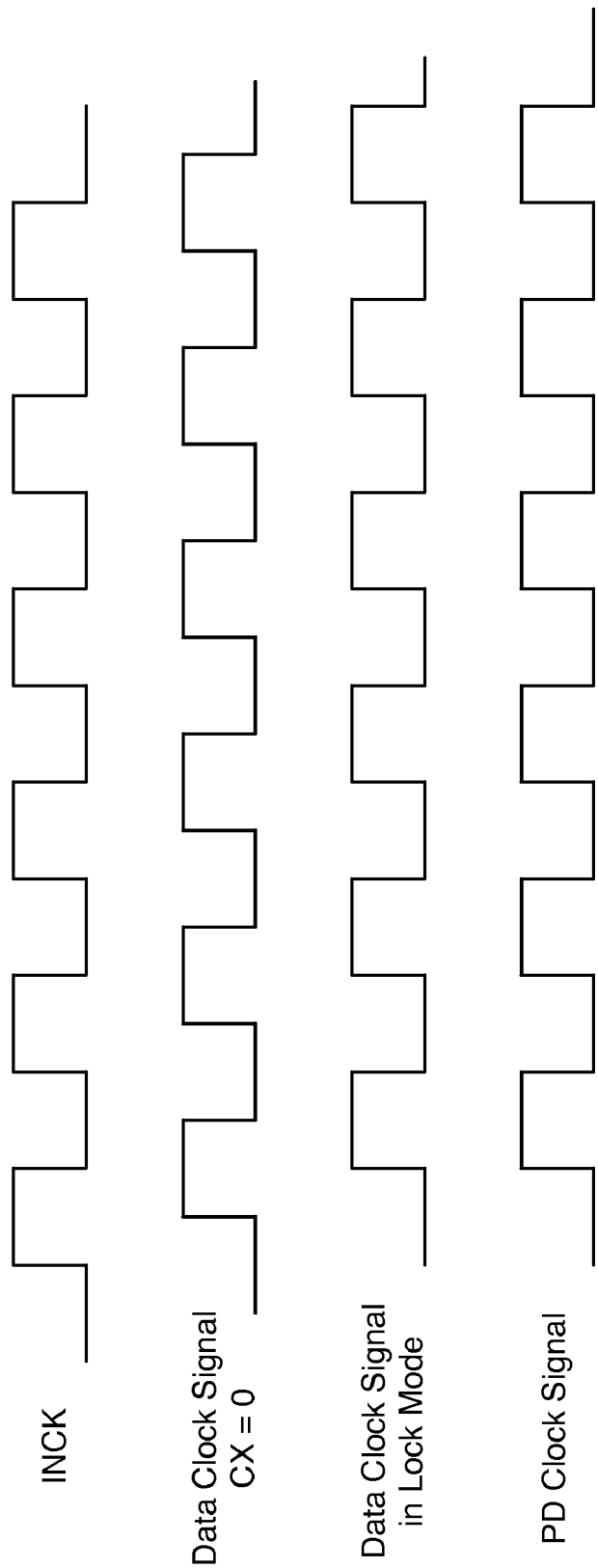
FIG. 4 illustrates examples of waveforms of four of the digital clock signals in the delay tracker circuit of FIG. 3, according to an embodiment of the present invention.

FIG. 4 illustrates examples of waveforms for four of the digital clock signals in delay tracker circuit 300, according to an embodiment of the present invention. FIG. 4 illustrates example waveforms for input clock signal INCK, the data clock signal when count signals CX[1:Q]=0, the data clock signal in lock mode, and the PD clock signal. As shown in FIG. 4, the phase of the PD clock signal is aligned with the phase of the data clock signal in lock mode.

To improve the capture window of phase detector 303, the number of delay circuit elements in the delay path can be increased as long as the number of delay circuit elements in the PD clock signal path is twice the number of delay circuit elements in the data clock signal path. An increase of delay circuit elements in the data clock signal path increases the data delay at phase detector 303 when counter 304 changes the delay of the delay circuit elements in the data clock signal path by one step delay and helps to meet the setup and hold requirements of the phase detector 303.

Figure 5:
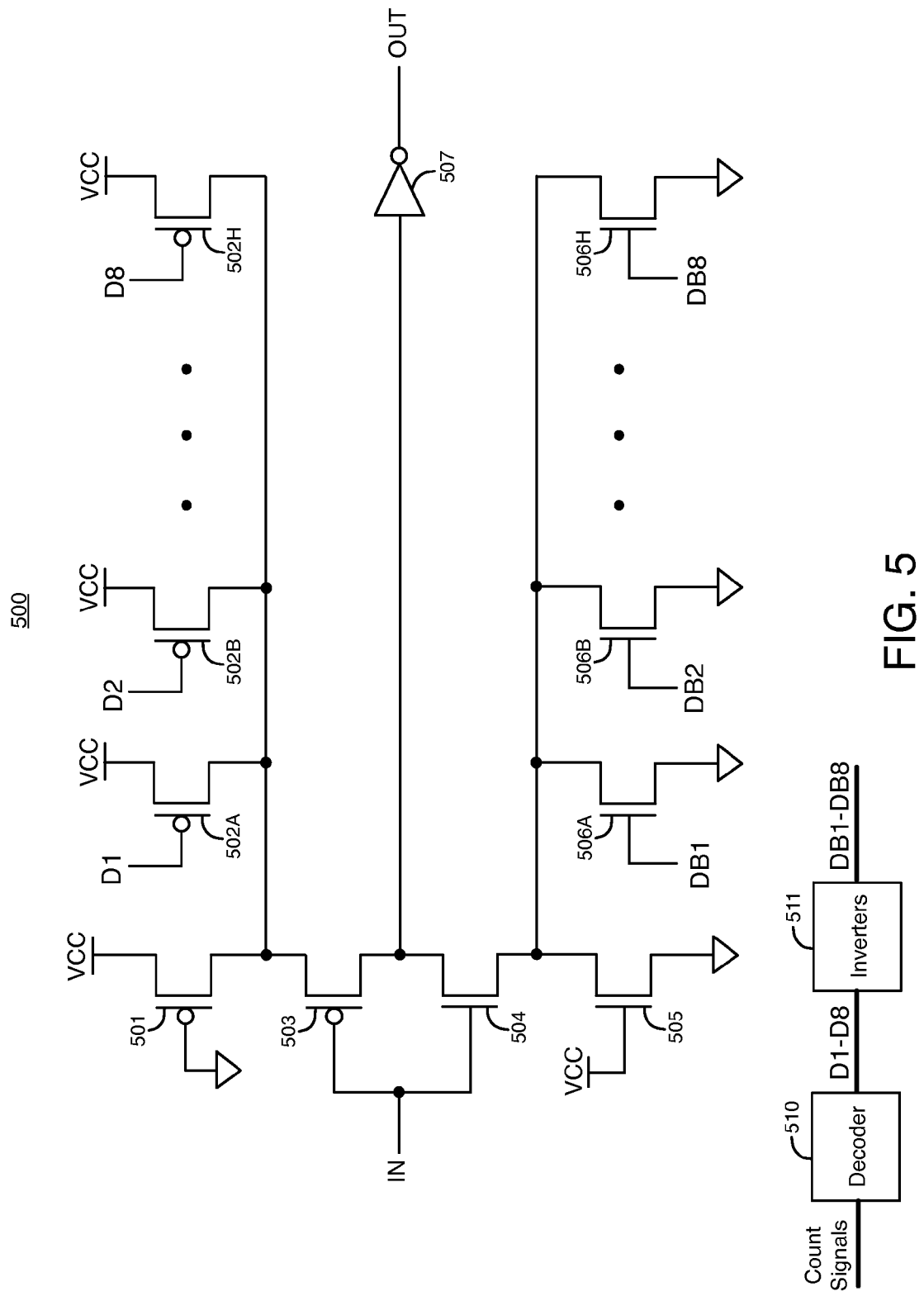
FIG. 5 illustrates an example of a delay circuit element that uses a current starving design, according to an embodiment of the present invention.

FIG. 5 illustrates an example of a delay circuit element 500 that uses a current starving design, according to an embodiment of the present invention. Delay circuit element 500 shown in FIG. 5 is an example of delay circuit elements 201A-201H, 209A-209D, and the delay circuit elements in delay chains 301, 302A, and 302B. Delay circuit element 500 includes p-channel metal oxide semiconductor field-effect transistors (MOSFETs) 501, 502A-502H, and 503. Delay circuit element 500 also includes n-channel MOSFETs 504, 505, and 506A-506H. Delay circuit element 500 further includes CMOS inverter 507, decoder 510, and inverters 511. Although delay circuit element 500 includes 8 transistors 502A-502H and 8 transistors 506A-506H, a delay circuit element can include any suitable number of transistors 502 and 506.

Transistors 503 and 504 are coupled together to form an inverter. The gate terminals of transistors 503 and 504 are coupled to input terminal IN of the delay circuit element 500, the drains of transistors 503 and 504 are coupled to the input terminal of inverter 507, and the output terminal of inverter 507 is coupled to the output terminal OUT of delay circuit element 500.

Inverter 503/504 and inverter 507 are coupled together in series between the input terminal IN of delay circuit element 500 and the output terminal OUT of delay circuit element 500. Inverters 503/504 and 507 delay input signals received at input terminal IN to generate a delayed signal at output terminal OUT. Because delay circuit element 500 contains two inverters coupled in series, delay circuit element 500 does not invert the output signal at output terminal OUT relative to the input signal received at input terminal IN.

The input terminal IN of delay circuit element 500 may be coupled to the output terminal OUT of a previous delay circuit element in a delay chain, and the output terminal OUT of delay circuit element 500 may be coupled to the input terminal IN of a subsequent delay circuit element in the delay chain. For example, if delay circuit elements 201 are implemented using the architecture of FIG. 5, delay circuit element 201B delays an input clock signal received at input terminal IN from the output terminal OUT of delay circuit element 201A and generates a delayed clock signal at output terminal OUT, which is transmitted to the input terminal IN of delay circuit element 201C.

The gate of p-channel transistor 501 is coupled to ground, the source of transistor 501 is coupled to supply voltage VCC, and the drain of transistor 501 is coupled to the source of transistor 503. When the supply voltage VCC is at its nominal operating voltage, transistor 501 conducts current in its saturation region from supply voltage VCC to transistor 503. The gate of n-channel transistor 505 is coupled to supply voltage VCC, the source of transistor 505 is coupled to ground, and the drain of transistor 505 is coupled to the source of transistor 504. When the supply voltage VCC is at its nominal operating voltage, transistor 505 conducts current in its saturation region from transistor 504 to ground.

P-channel transistors 502A-502H are coupled in parallel between the supply voltage VCC and the source of transistor 503. N-channel transistors 506A-506H are coupled in parallel between the source of transistor 504 and ground.

Count signals are transmitted to delay circuit element 500 from a counter circuit (e.g., counter 203 or 304). Decoder 510 decodes the count signals to generate decoded p-channel digital control signals D1-D8. Decoded p-channel control signals D1-D8 are transmitted to the gates of p-channel transistors 502A-502H, respectively. Inverters 511 invert the decoded p-channel control signals to generate digital decoded n-channel control signals DB1-DB8. Decoded n-channel control signals DB1-DB8 are transmitted to the gates of n-channel transistors 506A-506H, respectively. Decoder 510 can decode P count signals to generate a $2^P$ number of decoded p-channel control signals.

The binary value of the count signals determines the number of transistors 502 and 506 that are turned on to supply current through transistors 503-504. The counter circuit adjusts the binary value of the count signals to vary the delay of delay circuit element 500 by varying the number of transistor pairs 502/506 that are turned on.

Decoder 510 selects the logic states of the D1-D8 and DB1-DB8 control signals based on the binary value of the count signals. Decoder 510 generates an additional 1 in the D1-D8 signals in response to each increase of 1 in the binary value of the count signals. For example, decoder 510 decodes count signals having a binary value of 110 to generate D1-D8 signals having logic states of 00111111 and DB1-DB8 signals having logic states of 11000000. A logic high state (1) at the gate of one of transistors 502A-502H turns off that transistor, and a logic low state (0) at the gate of one of transistors 502A-502H turns on that transistor in its saturation region. A logic low state (0) at the gate of one of transistors 506A-506H turns off that transistor, and a logic high state (1) at the gate of one of transistors 506A-506H turns on that transistor in its saturation region.

According to one embodiment, the width-to-length (W:L) channel ratio of each of the transistors 502A-502H can be the same, and the W:L channel ratio of each of the transistors 506A-506H can be the same. In this embodiment, the current through transistors 503-504 ideally increases linearly with each additional transistor pair 502/506 that is turned on. However, each additional transistor 502 adds capacitance at the source of transistor 503, and each additional transistor 506 adds capacitance at the source of transistor 504. According to another embodiment, the W:L channel ratios of transistors 502A-502H increase from left to right in FIG. 5, and the W:L channel ratios of transistors 506A-506H increase from left to right in FIG. 5. During the design of delay circuit element 500, the W:L channel ratios of transistors 502 and 506 can be selected to cause delay circuit element 500 to generate a desired step delay.

Delay circuit element 500 generates a minimum delay $D_{MIN}$ and a maximum current $I_{MAX}$ through transistors 503-504 when all of the transistors 502A-502H and 506A-506H are on and conducting current in their saturation regions. Delay element 500 generates a maximum delay $D_{MAX}$ and a minimum current $I_{MIN}$ through transistors 503-504 when all of the transistors 502A-502H and 506A-506H are off and not conducting current. The minimum current $I_{MIN}$ is generated by transistors 501 and 505. The capacitance when $I_{MAX}$ is flowing through transistors 503-504 is the same as the capacitance when $I_{MIN}$ is flowing through transistors 503-504.

The fraction $D_{MAX}/D_{MIN}$ equals the fraction $I_{MIN}/I_{MAX}$. The ratio of $D_{MAX}$ to $D_{MIN}$ is nearly constant across variations in the process, supply voltage, and temperature (PVT) of delay circuit element 500 if each of transistors 502A-502H has the same or about the same W:L channel ratio and each of transistors 506A-506H has the same or about the same W:L channel ratio.

For example, if the W:L channel ratio of each of transistors 502A-502H is K times the W:L channel ratio of each of transistors 501 and 503, and if the W:L channel ratio of each of transistors 506A-506H is K times the W:L channel ratio of each of transistors 504 and 505, then $I_{MIN}/I_{MAX}$ equals K, and $D_{MAX}/D_{MIN}$ equals K, where K is substantially constant across PVT variations in circuit 500. If a P number of count signals are transmitted to delay circuit element 500 to control a $2^P$ number of transistors 502 and a $2^P$ number of transistors 506, then the difference between the maximum delay and the minimum delay of delay circuit element 500 is equivalent to $2^P$, as shown below in equation (11). Substituting $D_{MAX}/D_{MIN}=K$ into equation (11) yields equation (12), which is rearranged in equation (13).

$$D_{MAX}-D_{MIN}=2^P \tag{11}$$

$$(K \times D_{MIN}) - D_{MIN} = 2^P \tag{12}$$

$$D_{MIN} \equiv \frac{2^P}{(K-1)} = C_{MIN} \tag{13}$$

The values of P and K are determined during the design of circuits 200 and 500. Delay tracker 204 uses the known values of P and K to determine $C_{MIN}$ from equation (13). Phase offset calculator 205 then uses that value of $C_{MIN}$ in equation (6) along with input value X to calculate the Phase Offset value. The Phase Offset value is added to or subtracted from the binary value of the count signals CT[1:Q] to generate a binary value for the adjusted count signals CADJ[1:Q] that compensates for at least a portion of any changes in the delays of delay circuit elements 209A-209D caused by process, supply voltage, or temperature variations in circuit 200. The Phase Offset value increases the accuracy of the phase of the delayed DQS strobe signal with respect to a target phase. This embodiment can be implemented in circuit 200 in software or hardware (e.g., with hardwired circuits or programmable logic circuits).

When process, supply voltage, or temperature variations occur in circuits 200 and 500, K remains substantially constant. Therefore, K can be used to reduce the effects of process, supply voltage, and temperature variations on the phase offset calculation of equation (6).

Circuit 200 can generate a delayed DQS strobe signal at the output terminal of delay circuit element 209D that has a greater accuracy using one of the embodiments of delay tracker 204 and phase offset calculator 205 that are described above. For example, if the input clock signal INCK has a frequency 533 MHz, a standard DLL generates an accuracy of +/−45 degrees. Circuit 200, on the other hand, can generate an accuracy of +/−2.25 degrees with an input clock signal frequency of 533 MHz and $(C_{MIN}+CT[1:Q]_{LOCK})=16$, using equation (5). Each increase of 1 or decrease of 1 in the binary value of the count signals CADJ[1:Q] varies the delay of each delay circuit element 209 by 2.25 degrees in this example.

Because the DLL formed by circuits 201-203 is digitally controlled, the DLL can only increment or decrement the count signals CT[1:Q] by integer values. Therefore, a system that relies on this DLL to generate a phase shifted delayed DQS strobe signal should be able to tolerate an error of less than 1 in the count signals CADJ[1:Q]. The error tolerance of the system can be balanced on the error around K. The variation in K that can be tolerated corresponds to a value of 1 in the count signals CADJ[1:Q] (i.e., one step delay). Thus, a circuit sizing scheme that manipulates the W:L channel ratio of each transistor 502 and 506 can generate a device that tracks variations in the minimum delay of the delay circuit elements.

The accuracy of circuit 200 with respect to the phase offset in the delayed DQS strobe signal can be improved by adding more transistors 502 and 506 in each delay circuit element that are turned on and off by the count signals. However, the minimum accuracy that can be attained from circuit 200 is $\pm((D_{STEP}/T)*360)$ degrees, where T is the period of the input clock signal INCK.

Circuit 200 typically has an intrinsic delay that cannot be modified. For example, if the step delay of the delay circuit elements remains constant, the step delay becomes a larger percentage of the period of the input clock signal INCK at larger frequencies of INCK. $CT[1:Q]_{LOCK}$ is a smaller number at larger frequencies of INCK which affects the accuracy of circuit 200. For example, if the input clock signal frequency is 800 MHz, the accuracy of circuit 200 is +/−3.5 degrees, assuming a step delay of 12 ps. The step delay limits the accuracy of circuit 200.

Figure 6:
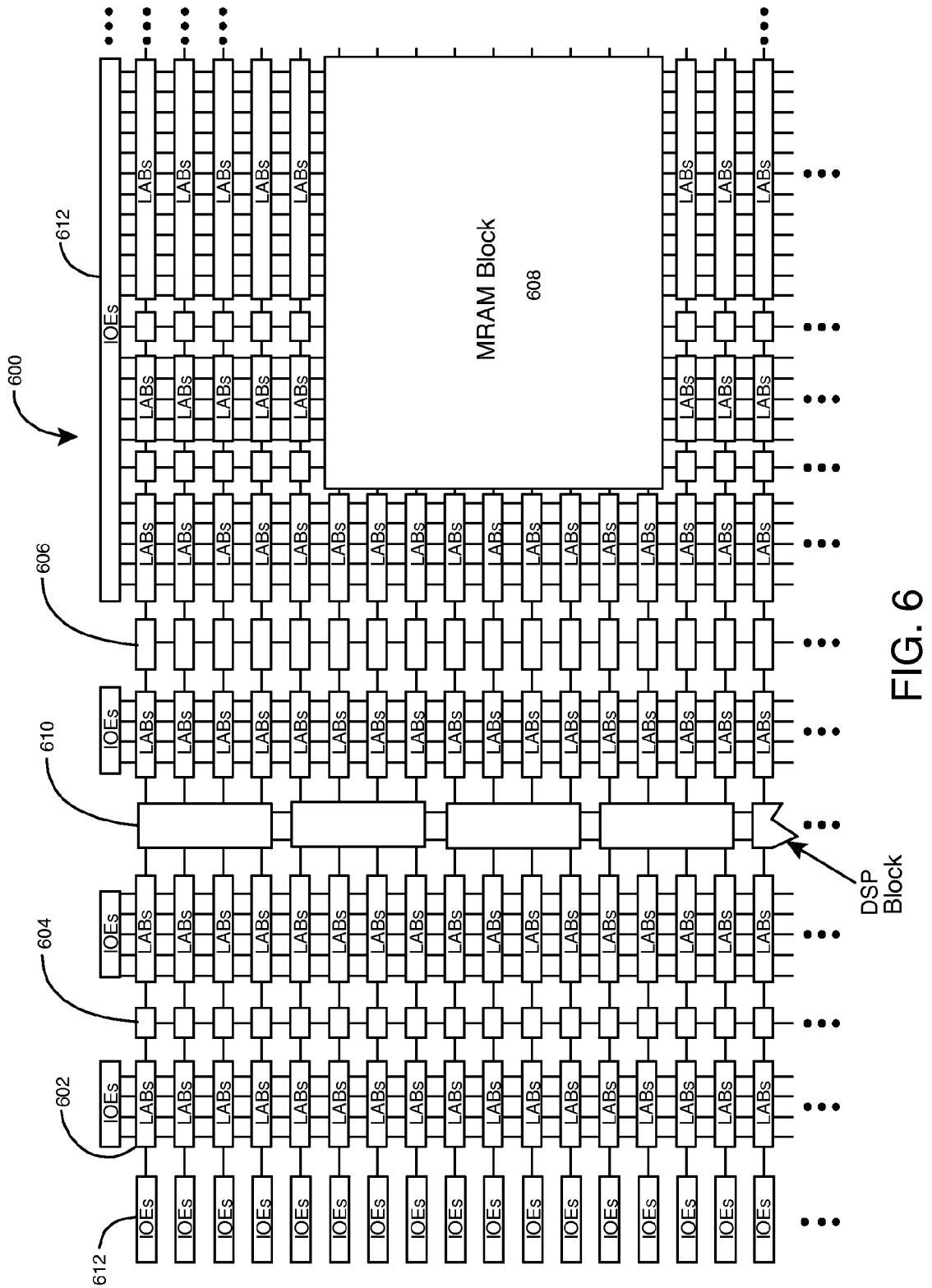
FIG. 6 is a simplified partial block diagram of a field programmable gate array (FPGA) that can include aspects of the present invention.

FIG. 6 is a simplified partial block diagram of a field programmable gate array (FPGA) 600 that can include aspects of the present invention. FPGA 600 is merely one example of an integrated circuit that can include features of the present invention. It should be understood that embodiments of the present invention can be used in numerous types of integrated circuits such as field programmable gate arrays (FPGAs), programmable logic devices (PLDs), complex programmable logic devices (CPLDs), programmable logic arrays (PLAs), and application specific integrated circuits (ASICs).

FPGA 600 includes a two-dimensional array of programmable logic array blocks (or LABs) 602 that are interconnected by a network of column and row interconnect conductors of varying length and speed. LABs 602 include multiple (e.g., 10) logic elements (or LEs).

An LE is a programmable logic circuit block that provides for efficient implementation of user defined logic functions. An FPGA has numerous logic elements that can be configured to implement various combinatorial and sequential functions. The logic elements have access to a programmable interconnect structure. The programmable interconnect structure can be programmed to interconnect the logic elements in almost any desired configuration.

FPGA 600 also includes a distributed memory structure including random access memory (RAM) blocks of varying sizes provided throughout the array. The RAM blocks include, for example, blocks 604, blocks 606, and block 608. These memory blocks can also include shift registers and FIFO buffers.

FPGA 600 further includes digital signal processing (DSP) blocks 610 that can implement, for example, multipliers with add or subtract features. Input/output elements (IOEs) 612 located, in this example, around the periphery of the chip, support numerous single-ended and differential input/output standards. IOEs 612 are coupled to input/output pins. Each of the input/output pins is an external terminal of the FPGA. It is to be understood that FPGA 600 is described herein for illustrative purposes only and that the present invention can be implemented in many different types of PLDs, FPGAs, and ASICs.

Figure 7:
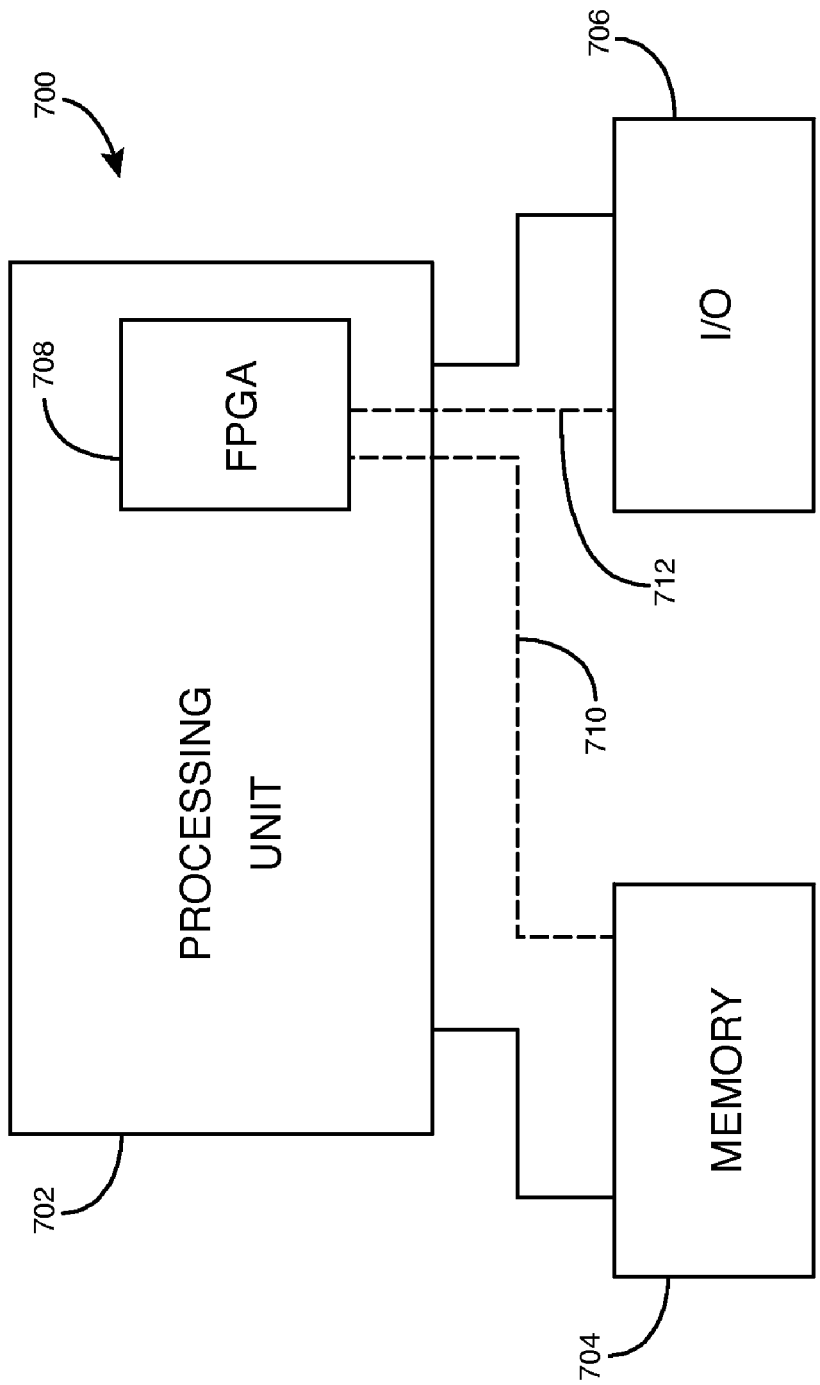
FIG. 7 shows a block diagram of an exemplary digital system that can embody techniques of the present invention.

The present invention can also be implemented in a system that has an FPGA as one of several components. FIG. 7 shows a block diagram of an exemplary digital system 700 that can embody techniques of the present invention. System 700 can be a programmed digital computer system, digital signal processing system, specialized digital switching network, or other processing system. Moreover, such systems can be designed for a wide variety of applications such as telecommunications systems, automotive systems, control systems, consumer electronics, personal computers, Internet communications and networking, and others. Further, system 700 can be provided on a single board, on multiple boards, or within multiple enclosures.

System 700 includes a processing unit 702, a memory unit 704, and an input/output (I/O) unit 706 interconnected together by one or more buses. According to this exemplary embodiment, an FPGA 708 is embedded in processing unit 702. FPGA 708 can serve many different purposes within the system of FIG. 7. FPGA 708 can, for example, be a logical building block of processing unit 702, supporting its internal and external operations. FPGA 708 is programmed to implement the logical functions necessary to carry on its particular role in system operation. FPGA 708 can be specially coupled to memory 704 through connection 710 and to I/O unit 706 through connection 712.

Processing unit 702 can direct data to an appropriate system component for processing or storage, execute a program stored in memory 704, receive and transmit data via I/O unit 706, or other similar functions. Processing unit 702 can be a central processing unit (CPU), microprocessor, floating point coprocessor, graphics coprocessor, hardware controller, microcontroller, field programmable gate array programmed for use as a controller, network controller, or any type of processor or controller. Furthermore, in many embodiments, there is often no need for a CPU.

For example, instead of a CPU, one or more FPGAs 708 can control the logical operations of the system. As another example, FPGA 708 acts as a reconfigurable processor, which can be reprogrammed as needed to handle a particular computing task. Alternatively, FPGA 708 can itself include an embedded microprocessor. Memory unit 704 can be a random access memory (RAM), read only memory (ROM), fixed or flexible disk media, flash memory, tape, or any other storage means, or any combination of these storage means.

The foregoing description of the exemplary embodiments of the present invention has been presented for the purposes of illustration and description. The foregoing description is not intended to be exhaustive or to limit the present invention to the examples disclosed herein. In some instances, features of the present invention can be employed without a corresponding use of other features as set forth. Many modifications, substitutions, and variations are possible in light of the above teachings, without departing from the scope of the present invention.

What is claimed is:

1. A circuit comprising:
a first locked loop operable to control a first delay in the first locked loop; and
a phase offset circuit operable to delay an input signal by a second delay, wherein the phase offset circuit comprises a second locked loop, wherein the second locked loop comprises first and second variable delay circuits and a phase detector operable to compare a signal delayed by the first variable delay circuit to a signal delayed by the second variable delay circuit for adjusting a delay of the first variable delay circuit, and wherein the second variable delay circuit has a fixed delay,
wherein the phase offset circuit is operable to adjust the second delay provided to the input signal based on changes the first locked loop provides to the first delay and based on changes the second locked loop provides to the delay of the first variable delay circuit, and
wherein the phase offset circuit is operable to compensate for at least a portion of a change in the second delay that is caused by a variation in at least one of a process, a supply voltage, and a temperature of the circuit.

2. The circuit defined in claim 1, wherein the first locked loop comprises a delay chain operable to delay a clock signal by the first delay, and wherein the phase offset circuit is operable to delay the input signal by the second delay to generate a delayed signal, wherein a maximum phase shift error between a phase of the delayed signal and a target phase is less than T/2N, wherein T is a period of the clock signal, and wherein N is a total number of delay circuits in the delay chain.

3. The circuit defined in claim 1, wherein the second locked loop further comprises:
a third variable delay circuit operable to delay a clock signal to generate a delayed clock signal that is provided to an input of the second variable delay circuit.

4. The circuit defined in claim 3, wherein delays of the second and the third variable delay circuits are held at minimum delays of the second and the third variable delay circuits.

5. The circuit defined in claim 1, wherein the phase offset circuit comprises an adder operable to add a value generated by the first locked loop to a value generated based on signals provided by the second locked loop to control the second delay provided to the input signal.

6. A circuit comprising:
a first locked loop operable to control a first delay in the first locked loop; and
a phase offset circuit comprising a second locked loop, wherein the second locked loop comprises first and second delay circuits and a phase detector operable to compare a signal delayed by the first delay circuit to a signal delayed by the second delay circuit for varying a delay of the first delay circuit, and wherein the first and the second delay circuits have the same circuit architecture, and
wherein the phase offset circuit is operable to adjust a second delay based on the first delay and the delay of the first delay circuit to compensate for at least a portion of a change in the second delay that is caused by a variation in at least one of a process, a supply voltage, and a temperature of the circuit.

7. The circuit defined in claim 1, wherein the first locked loop is a first delay-locked loop circuit, and the second locked loop is a second delay-locked loop circuit.

8. The circuit defined in claim 6, wherein the phase offset circuit is operable to adjust the second delay based on a maximum value of the delay of the first delay circuit divided by a minimum value of the delay of the first delay circuit.

9. The circuit of claim 6, wherein the phase offset circuit is operable to adjust the second delay based on a minimum value of a current through the first delay circuit divided by a maximum value of the current through the first delay circuit.

10. A method for delaying a signal, the method comprising:
delaying a clock signal by a first delay in a first locked loop circuit to generate a feedback signal;
generating first control signals in the first locked loop circuit to control the first delay in response to the feedback signal;
delaying an input signal by a second delay that is controlled by second control signals to generate a delayed signal;
comparing a signal delayed by a first delay circuit to a signal delayed by a second delay circuit in a second locked loop circuit to generate third control signals for controlling a delay of the first delay circuit, wherein the first and the second delay circuits have the same circuit architecture; and
adjusting the first control signals based on the third control signals to generate the second control signals to at least partially compensate for a change in the second delay caused by a variation in at least one of a process, a supply voltage, and a temperature such that the second control signals increase an accuracy of the delayed signal with respect to a target phase.

11. The method defined in claim 10, wherein adjusting the first control signals based on the third control signals to generate the second control signals further comprises adding phase offset signals generated based on the third control signals to the first control signals to generate the second control signals.

12. The method defined in claim 10, wherein a maximum phase shift error between a phase of the delayed signal and the target phase is less than T/2N, wherein T is a period of the clock signal, and wherein N is a total number of delay circuits used to generate the first delay.

13. The method defined in claim 12 further comprising:
delaying the input signal by a third delay that is controlled by the second control signals, wherein delaying the input signal by the second delay and the third delay further comprise delaying a strobe signal by the second delay and the third delay so that an edge of the strobe signal occurs closer to a center of a data sampling window used for sampling data.

14. A method for delaying a signal, the method comprising:
delaying a clock signal by a first delay in a first locked loop circuit to generate a feedback signal;
generating first control signals that control the first delay in response to the feedback signal;
delaying an input signal by a second delay that is controlled by second control signals to generate a delayed signal;
comparing a signal delayed by a first variable delay circuit to a signal delayed by a second variable delay circuit in a second locked loop circuit to generate third control signals for controlling a delay of the first variable delay circuit, wherein the second variable delay circuit has a fixed delay; and adjusting the first control signals to generate the second control signals based on the third control signals to at least partially compensate for a change in the second delay caused by a variation in at least one of a process, a supply voltage, and a temperature.

15. The method of claim 14, wherein the first and second variable delay circuits have the same circuit architecture.

16. A circuit comprising:
a first locked loop operable to generate first control signals for controlling a delay in the first locked loop;
a first delay circuit operable to delay a signal by a delay, wherein the delay of the first delay circuit is controlled by second control signals, and the first delay circuit is outside the first locked loop; and
an adjustment circuit comprising a second locked loop, wherein the second locked loop is operable to compare a signal delayed by a second delay circuit to a signal delayed by a third delay circuit for generating third control signals that control a delay of the second delay circuit, wherein the third delay circuit is a variable delay circuit having a delay that is fixed at a minimum delay of the third delay circuit,
wherein the adjustment circuit is operable to adjust the first control signals to generate the second control signals based on the third control signals in order to at least partially compensate for a change in the delay of the first delay circuit that is caused by a variation in at least one of a process, a supply voltage, and a temperature of the circuit.

17. The circuit defined in claim 16, wherein the second locked loop comprises:
a fourth delay circuit;
a phase detector operable to compare a phase of a periodic signal after being delayed by the second delay circuit to a phase of the periodic signal after being delayed by the third and the fourth delay circuits; and
a control circuit operable to generate the third control signals to control the delay of the second delay circuit in response to an output signal of the phase detector, wherein the fourth delay circuit is a variable delay circuit having a delay that is fixed at a minimum delay of the fourth delay circuit.

18. The circuit defined in claim 16, wherein the adjustment circuit is operable to adjust the first control signals based on a maximum delay of the first delay circuit divided by a minimum delay of the first delay circuit.

19. The circuit defined in claim 16, wherein the first locked loop comprises a delay chain, a phase detector operable to compare phases of an input clock signal and a feedback signal from the delay chain, and a control circuit operable to generate the first control signals for controlling a delay of the delay chain in response to an output signal of the phase detector, and
wherein the adjustment circuit is operable to adjust the first control signals based on a maximum delay of a fourth delay circuit in the delay chain divided by a minimum delay of the fourth delay circuit.

20. The circuit defined in claim 16,
wherein the third delay circuit is operable to receive a signal delayed by a fourth delay circuit, and wherein the fourth delay circuit is a variable delay circuit having a delay that is fixed at a minimum delay of the fourth delay circuit.

21. The circuit defined in claim 16, wherein the first delay circuit is operable to delay a strobe signal, wherein strobing occurs close to a center of a data sampling window used for sampling data.

22. The circuit defined in claim 16, wherein the circuit is fabricated on a programmable logic integrated circuit.

23. The circuit defined in claim 16, wherein the first locked loop comprises a delay-locked loop.

24. The circuit defined in claim 16, wherein the first locked loop comprises a digitally controlled locked loop.

25. The circuit defined in claim 16, wherein the first locked loop is a first delay-locked loop circuit, and the second locked loop is a second delay-locked loop circuit.

* * * * *